US011930600B2

United States Patent
Shinyama et al.

(10) Patent No.: US 11,930,600 B2
(45) Date of Patent: Mar. 12, 2024

(54) THREE-DIMENSIONAL MEASUREMENT APPARATUS AND THREE-DIMENSIONAL MEASUREMENT METHOD

(71) Applicant: CKD CORPORATION, Aichi (JP)

(72) Inventors: Takayuki Shinyama, Aichi (JP); Tsuyoshi Ohyama, Aichi (JP); Norihiko Sakaida, Aichi (JP)

(73) Assignee: CKD CORPORATION, Aichi (JP)

( * ) Notice: Subject to any disclaimer, the term of this patent is extended or adjusted under 35 U.S.C. 154(b) by 328 days.

(21) Appl. No.: 17/523,266

(22) Filed: Nov. 10, 2021

(65) Prior Publication Data

US 2022/0071073 A1    Mar. 3, 2022

Related U.S. Application Data

(63) Continuation of application No. PCT/JP2020/015674, filed on Apr. 7, 2020.

(30) Foreign Application Priority Data

May 29, 2019    (JP) ................................. 2019-099886

(51) Int. Cl.
*G01B 11/25*    (2006.01)
*G01B 11/06*    (2006.01)
(Continued)

(52) U.S. Cl.
CPC ..... *H05K 13/0817* (2018.08); *G01B 11/0608* (2013.01); *G01B 11/2513* (2013.01);
(Continued)

(58) Field of Classification Search
CPC ............. H05K 13/0817; H05K 13/083; G01B 11/0608; G01B 11/2513; G01B 11/002;
(Continued)

(56) References Cited

U.S. PATENT DOCUMENTS 10,317,205 B2 *   6/2019   Gill .................... G02B 27/1086
2007/0177159 A1 *  8/2007   Kim ........................ G06T 7/521
356/601

(Continued)

FOREIGN PATENT DOCUMENTS

JP    2004-198129 A    7/2004
JP    2014-504721 A    2/2014

OTHER PUBLICATIONS

International Preliminary Report on Patentability issued in corresponding International Application No. PCT/JP2020/015674 dated Nov. 16, 2021 (10 pages).

(Continued)

*Primary Examiner* — Isiaka O Akanbi
(74) *Attorney, Agent, or Firm* — Osha Bergman Watanabe & Burton LLP

(57) ABSTRACT

A three-dimensional measurement apparatus measures measurement targets placed in a target measurement area on a measurement object. The apparatus includes: a measurement module that: is positioned with respect to the target measurement area, and includes: a first irradiator that irradiates the target measurement area with predetermined light for height measurement; a second irradiator that irradiates the target measurement area with predetermined patterned light for three-dimensional measurement; and an imaging device that takes an image of the target measurement area; and a control device that moves the measurement module in a height direction and successively positions the measurement module at a predetermined height position determined by mapping, and performs, based on image data taken by irradiating the target measurement area with predetermined patterned light, three-dimensional measurement to the measurement targets at the predetermined height position.

16 Claims, 6 Drawing Sheets

(51) Int. Cl.
*G01N 21/956* (2006.01)
*H05K 13/08* (2006.01)
*G01B 11/00* (2006.01)

(52) U.S. Cl.
CPC ..... *G01N 21/95684* (2013.01); *H05K 13/083* (2018.08); *G01B 11/002* (2013.01); *G01N 2021/95646* (2013.01)

(58) Field of Classification Search
CPC ............ G01B 11/25; G01N 21/95684; G01N 2021/95646; G06T 7/00
USPC ....................................... 356/237.2, 601–624
See application file for complete search history.

(56) References Cited

U.S. PATENT DOCUMENTS

| | | | | |
|---|---|---|---|---|
| 2011/0002529 | A1* | 1/2011 | Jeong | G01B 11/25 382/147 |
| 2011/0191050 | A1* | 8/2011 | Jeong | G16Z 99/00 356/601 |
| 2011/0254949 | A1* | 10/2011 | You | H04N 23/71 348/135 |
| 2012/0127461 | A1* | 5/2012 | Jeong | G01B 11/2527 356/237.2 |
| 2013/0278723 | A1* | 10/2013 | Yu | G01B 11/2531 348/46 |
| 2014/0219542 | A1* | 8/2014 | Lee | G06T 7/0004 382/147 |
| 2016/0209206 | A1* | 7/2016 | Yu | G01B 11/167 |
| 2017/0276617 | A1* | 9/2017 | Umemura | H04N 23/56 |
| 2017/0289416 | A1* | 10/2017 | Umemura | G01B 11/002 |
| 2018/0135975 | A1* | 5/2018 | Ohyama | G06T 7/0004 |

OTHER PUBLICATIONS

International Search Report issued in corresponding International Application No. PCT/JP2020/015674 dated Jul. 7, 2020 (5 pages).
Written Opinion issued in corresponding International Application No. PCT/JP2020/015674 dated Jul. 7, 2020 (3 pages).

* cited by examiner

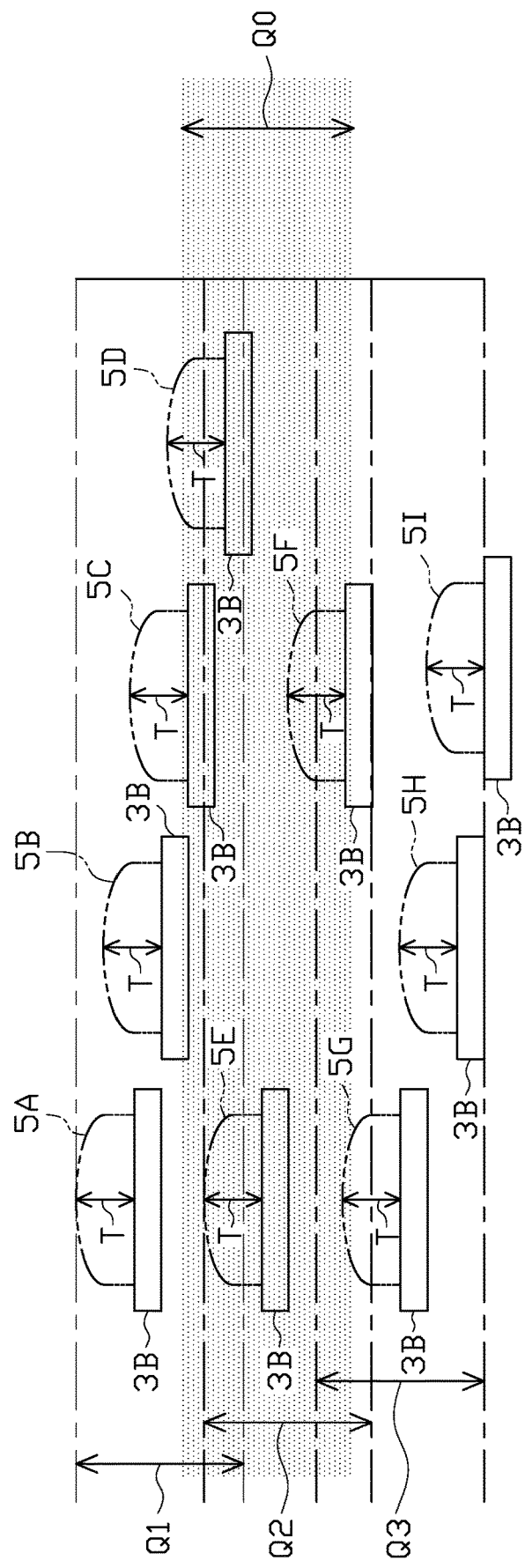

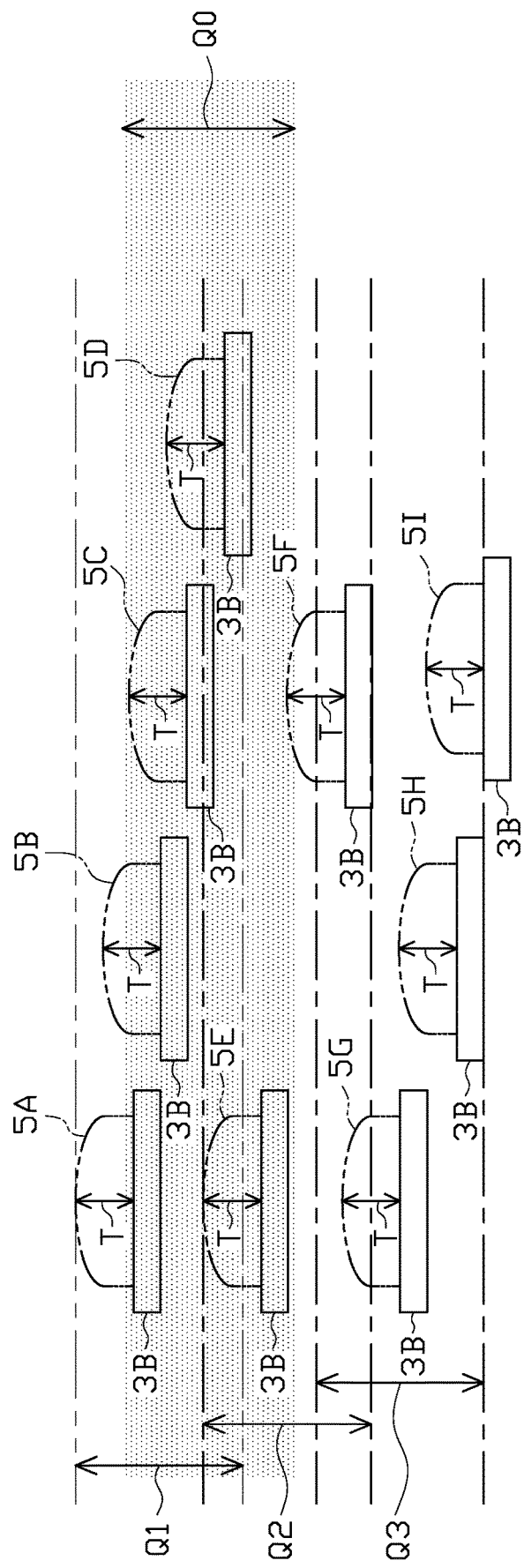

THREE-DIMENSIONAL MEASUREMENT APPARATUS AND THREE-DIMENSIONAL MEASUREMENT METHOD

BACKGROUND

Technical Field

The present invention relates to a three-dimensional measurement apparatus configured to perform three-dimensional measurement of a printed circuit board or the like, and a three-dimensional measurement method.

Description of Related Art

In the case of mounting an electronic component on a printed circuit board, a general procedure first prints solder paste on a predetermined electrode pattern laid on the printed circuit board. The procedure then temporarily fastens the electronic component on the printed circuit board by taking advantage of the viscosity of the solder paste. The printed circuit board is then led into a reflow furnace to be subjected to a predetermined reflow process that implements soldering. A recent trend is the need for inspection of the printing state of solder paste in a stage before the printed circuit board is led into the reflow furnace. A three-dimensional measurement apparatus may be used for such inspection.

Various configurations of three-dimensional measurement apparatus have conventionally been proposed to perform three-dimensional measurement by projecting predetermined patterned light. An especially known configuration of the three-dimensional measurement apparatus uses a phase shift method.

The three-dimensional measurement apparatus using the phase shift method includes a projection device configured to project patterned light having a light intensity distribution in a fringe shape (hereinafter referred to as "fringe pattern") obliquely downward to a predetermined inspection range on a printed circuit board; and an imaging device configured to take an image of the inspection range with the fringe pattern projected thereon.

The three-dimensional measurement apparatus having the configuration described above shifts the phase of the fringe pattern projected in the predetermined inspection range on the printed circuit board in a plurality of different shifts (for example, four different shifts) and takes images of the respective fringe patterns having different phases, so as to obtain a plurality of image data with regard to the inspection range. The three-dimensional measurement apparatus then performs three-dimensional measurement of the inspection range, based on the plurality of image data, by the phase shift method.

When the printed circuit board has a warpage or the like, however, this makes it difficult to keep part of the inspection range in the depth of field of the imaging device. This results in obtaining out-of-focus image data and is likely to decrease the measurement accuracy.

A recently proposed technique moves and adjusts a measurement head integrally provided with a projection device and an imaging device in a height direction prior to a start of measurement with regard to a predetermined inspection range on a printed circuit board, such as to keep a distance between the measurement head and the predetermined inspection range within a predetermined range (as described in, for example, Patent Literature 1 and Patent Literature 2).

PATENT LITERATURE

Patent Literature 1: JP 2004-198129A
Patent Literature 2: JP 2014-504721A

Conventionally, an imaging device has a narrow field of vision with a small number of pixels in an imaging element, and solder pastes printed on a printed circuit board are used for arithmetic circuits and all have small heights. Accordingly, adjustment of the height of the measurement head only once prior to a start of measurement with regard to a predetermined inspection range on a printed circuit board enables measurement of all solder pastes included in this one inspection range (visual field of imaging) to be completed without requiring any further height adjustment.

Recently, however, the number of pixels in the imaging element has remarkably been increased, and an identical resolution has enabled a wider area to be imaged. Accordingly, an inspection is more likely to be affected by a warpage or the like of the printed circuit board even in one inspection range.

Furthermore, with development of the half etching technique of a solder printing metal mask and the dispensing solder application technique, a demand for in-vehicle printed circuit boards including solder pastes of large heights for power circuits and motor circuits in addition to solder pastes of small heights for arithmetic circuits has been increased, accompanied with electrification of automobiles. Accordingly, in some cases, there is a large difference between the heights of solder pastes included in one inspection range.

As a result, it may be difficult to keep all solder pastes included in one inspection range (in a height range from solder paste located at the lowest most position to solder paste located at the highest most position) in the depth of field of the imaging device.

Accordingly, the conventional configuration that completes measurement of all the solder pastes included in one inspection range by only one measuring operation is unlikely to obtain in-focus image data with regard to all the solder pastes included in one inspection range. This may result in decreasing the measurement accuracy.

The above issues are not necessarily limited to three-dimensional measurement of, for example, solder paste printed on the printed circuit board but are observed in other fields of three-dimensional measurement. These issues are also not limited to the phase shift method.

SUMMARY

One or more embodiments of the present invention provide a three-dimensional measurement apparatus and a three-dimensional measurement method that achieve improvement of measurement accuracy and the like.

The following describes each of various aspects provided adequately to deal with the issues described above. Functions and advantageous effects that are characteristic of each of the aspects are also described as appropriate.

Aspect 1. There is provided a three-dimensional measurement apparatus configured to comprise a predetermined measurement module (or a predetermined measurement device; for example, a measurement head) positioned with respect to a predetermined target measurement area (for example, an entire area or a partial area of the measurement object) on a predetermined measurement object (for example, a printed circuit board) and to measure a plurality of measurement targets (for example, solder paste) placed in the target measurement area by a predetermined three-dimensional measurement technique (for example, a pattern projection technique). The measurement module comprises: a first irradiation unit (i.e., a first irradiator) configured to irradiate the target measurement area with predetermined light (for example, slit light) for height measurement in the target measurement area; a second irradiation unit (i.e., a second irradiator) configured to irradiate the target measurement area with predetermined patterned light for three-dimensional measurement of the measurement targets; and an imaging unit (i.e., an imaging device) configured to take an image of the target measurement area irradiated with either the predetermined light or the predetermined patterned light. The three-dimensional measurement apparatus comprises a control device that functions as: an area height obtaining module that obtains, based on image data taken by the imaging unit when the target measurement area is irradiated with the predetermined light, target height information on the measurement object within the target measurement area; a reference surface height obtaining module that calculates, based on the target height information, reference height information on a reference surface of each of the measurement targets within the target measurement area; a required focusing range specification module that specifies, based on the reference height information, a required focusing range for imaging an entire range in a height direction of each of the measurement targets in a focusing state; a mapping module that maps a height position of the measurement module (at least the imaging unit thereof) to each of the measurement targets at the height position, based on the required focusing ranges with regard to the measurement targets and a depth of field of the imaging unit; a height adjustment module that moves the measurement module (at least the imaging unit thereof) in the height direction and successively positions the measurement module (at least the imaging unit thereof) at a predetermined height position determined by the mapping; and a three-dimensional measurement module that performs, based on image data taken by the imaging unit under the predetermined patterned light, three-dimensional measurement to the measurement targets at the predetermined height position at which the measurement module (at least the imaging unit thereof) is positioned.

The three-dimensional measurement apparatus of above aspect 1 is configured to adjust the height of the measurement module (at least the imaging unit thereof) in the process of performing three-dimensional measurement to the measurement targets in the predetermined target measurement area on the measurement object.

More specifically, the three-dimensional measurement apparatus of this aspect first irradiates the target measurement area with predetermined light and measures the height of the measurement object within the target measurement area. The three-dimensional measurement apparatus subsequently determines the height of the reference surface of each of the measurement targets included in the target measurement area based on the target height information and specifies the required focusing range for imaging the entire range of each measurement target in the height direction in the focusing state.

The three-dimensional measurement apparatus subsequently maps the height position of the measurement module (at least the imaging unit thereof) to each of the measurement targets at the height position, based on the required focusing ranges of the respective measurement targets and the depth of field of the imaging unit. The three-dimensional measurement apparatus then successively moves the measurement module (at least the imaging unit thereof) to the predetermined height position determined by the mapping and performs measurement of solder with regard to the measurement object at the height position.

This configuration enables three-dimensional measurement to be performed with regard to all the measurement targets included in one target measurement area (in the height range from the measurement target at the lowest most position to the measurement target at the highest most position) by using the image data taken in the appropriate focusing state. As a result, this configuration achieves improvement of the measurement accuracy and the like.

Aspect 2. The three-dimensional measurement apparatus described in above aspect 1 may further comprise a frequency determination module (i.e., the control device) configured to determine, before the measurement module is moved in the height direction, whether a required number of times of the three-dimensional measurement in the target measurement area increases by performing the three-dimensional measurement by the three-dimensional measurement module at an initial height position where the measurement module is positioned with respect to the target measurement area. When the required number of times of the three-dimensional measurements does not increase, the three-dimensional measurement module may perform a first three-dimensional measurement at the initial height position.

The configuration of above aspect 2 decreases the number of moves (the number of times of height adjustment) of the measurement module (at least the imaging unit thereof) in the height direction by one. This configuration accordingly shortens the total measurement time with regard to one target measurement area.

Aspect 3. The three-dimensional measurement apparatus described in either above aspect 1 or above aspect 2 may further comprise a distance determination module (i.e., the control device) configured to determine which is shorter between a moving distance from an initial height position where the measurement module (at least the imaging unit thereof) is aligned to the target measurement area to a lowest most height position, among a plurality of height positions of the measurement module determined by the mapping, and a moving distance from the initial height position to a highest most height position, in a case where the height of the measurement module is adjusted. The height adjustment module may move the measurement module (at least the imaging unit thereof) from the initial height position to either the lowest most height position or the highest most height position having the shorter moving distance.

The configuration of above aspect 3 shortens the total moving distance in the height direction required for completion of measurement of all the measurement targets included in one target measurement area. As a result, this configuration shortens the total measurement time with regard to one target measurement area.

Aspect 4. In the three-dimensional measurement apparatus described in any one of above aspects 1 to 3, the mapping module may map the height position of the measurement module (at least the imaging unit thereof) to each of the measurement targets such that at least one depth of field includes an entire required focusing range of the measurement targets.

The configuration of above aspect 4 enables three-dimensional measurement to be performed with regard to the entirety in the height direction of the measurement targets simultaneously at least once without dividing the measurement targets in the height direction. This achieves improvement of the measurement accuracy.

Aspect 5. There is provided a three-dimensional measurement method using a predetermined measurement module (for example, a measurement head) that includes a predetermined irradiation unit (i.e., a predetermined irradiator) and a predetermined imaging unit (i.e., an imaging device) and that is positioned with respect to a predetermined target measurement area (a whole area or a partial area of the measurement object) on a predetermined measurement object (for example, a printed circuit board) and performing three-dimensional measurement to a plurality of measurement targets (for example, solder paste) placed in the target measurement area by a predetermined three-dimensional measurement technique (for example, a pattern projection technique). The three-dimensional measurement method comprises: an area height obtaining process of obtaining target height information on the measurement object within the target measurement area based on image data taken by irradiating the target measurement area with predetermined light (for example, slit light); a reference surface height obtaining process of calculating, based on the target height information, reference height information on a reference surface of each of the measurement targets within the target measurement area; a required focusing range specification process of specifying, based on the reference height information, a required focusing range for imaging an entire range in a height direction of each of the measurement targets in a focusing state; a mapping process of mapping a height position of the measurement module (at least the imaging unit thereof) to each of the measurement targets at the height position based on the required focusing ranges with regard to the measurement targets and a depth of field of the imaging unit; a height adjustment process of moving the measurement module (at least the imaging unit thereof) in the height direction and of successively positioning the measurement module (at least the imaging unit thereof) at a predetermined height position determined by the mapping; and a three-dimensional measurement process of performing, based on image data taken by irradiating the target measurement area with predetermined patterned light, three-dimensional measurement to the measurement targets at the predetermined height position at which the measurement module (at least the imaging unit thereof) is positioned.

The configuration of aspect 5 described above has similar functions and advantageous effects to those of aspect 1 described above.

Aspect 6. The three-dimensional measurement method described in above aspect 5 may further comprise a frequency determination process of determining whether a required number of times of the three-dimensional measurements in the target measurement area increases by performing the three-dimensional measurement at an initial height position where the measurement module is aligned to the target measurement area, in a previous step prior to the height adjustment process. When the required number of times of the three-dimensional measurements does not increase, a first three-dimensional measurement may be performed at the initial height position.

The configuration of aspect 6 described above has similar functions and advantageous effects to those of aspect 2 described above.

Aspect 7. The three-dimensional measurement method described in either above aspect 5 or above aspect 6 may further comprise a distance determination process of determining which is shorter between a moving distance from an initial height position where the measurement module (at least the imaging unit thereof) is aligned to the target measurement area to a lowest most height position, among a plurality of height positions of the measurement module determined by the mapping, and a moving distance from the initial height position to a highest most height position, in a case where the height adjustment process is performed. The height adjustment process may move the measurement module (at least the imaging unit thereof) from the initial height position to either the lowest most height position or the highest most height position having the shorter moving distance.

The configuration of aspect 7 described above has similar functions and advantageous effects to those of aspect 3 described above.

Aspect 8. In the three-dimensional measurement method described in any one of above aspects 5 to 7, the mapping process may map the height position of the measurement module (at least the imaging unit thereof) to each of the measurement targets such that at least one depth of field includes an entire required focusing range of the measurement targets.

The configuration of aspect 8 described above has similar functions and advantageous effects to those of aspect 4 described above.

The above "measurement object" is, for example, a printed circuit board with solder paste printed (or applied) thereon. Using the three-dimensional measurement apparatus (the three-dimensional measurement method) described in each of the above aspects enables three-dimensional measurement to be performed with regard to the solder paste printed or the like on the printed circuit board. This enables good/poor quality judgment of solder paste to be performed based on these measurement values in inspection of the solder paste. This inspection accordingly has the functions and the advantageous effects described above and enables the good/poor quality judgement to be performed with high accuracy. As a result, this configuration achieves improvement of the inspection accuracy in solder inspection.

The "predetermined patterned light for three-dimensional measurement" described above is, for example, patterned light (fringe pattern) having a light intensity distribution in a fringe shape (for example, in a sinusoidal shape). Irradiation with such pattered light enables three-dimensional measurement to be performed by the phase shift method. As a result, this achieves improvement of the measurement accuracy in three-dimensional measurement and the like.

In a configuration of performing three-dimensional measurement based on a difference in luminance value among a plurality of image data taken and obtained by using patterned light having different phases, as in the case of the phase shift method, even a slight error of the luminance value is likely to significantly affect the measurement accuracy. The functions and the advantageous effects of the respective aspects described above are thus more effective in the configuration of performing the three-dimensional measurement by the phase shift method. Especially, the patterned light having a light intensity distribution in a sinusoidal shape requires the higher accuracy, since this light intensity distribution (waveform) is readily deformable.

The three-dimensional measurement module (the three-dimensional measurement process) in the three-dimensional measurement apparatus (the three-dimensional measurement method) using the phase shift method is configured to perform three-dimensional measurement with respect to a plurality of measurement targets by the phase shift method, based on a plurality of image data with different light intensity distributions taken by irradiating the measurement targets with, for example, predetermined patterned light having a plurality of different phases.

BRIEF DESCRIPTION OF DRAWINGS

FIG. 6 is a schematic diagram illustrating one example of a mapping relationship between the height position of a measurement head and the solder paste that is a measured target at the height position; and FIG. 7 is a schematic diagram illustrating another example of the mapping relationship between the height position of the measurement head and the solder paste that is the measured target at the height position.

DETAILED DESCRIPTION OF EMBODIMENTS

Figure 2:
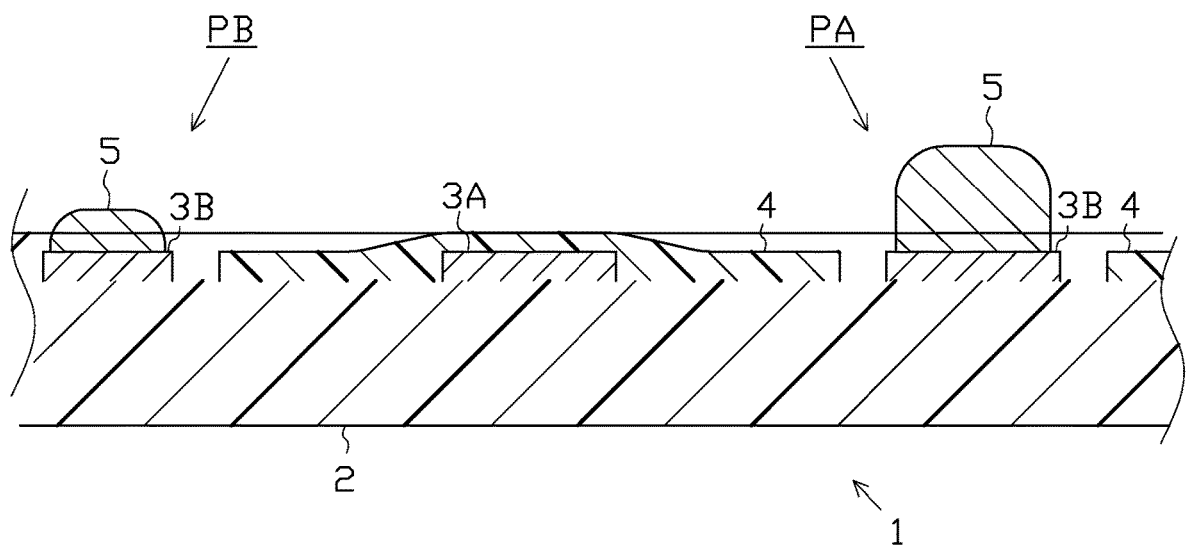
FIG. 2 is a partially enlarged sectional view of a printed circuit board.
Figure 3:
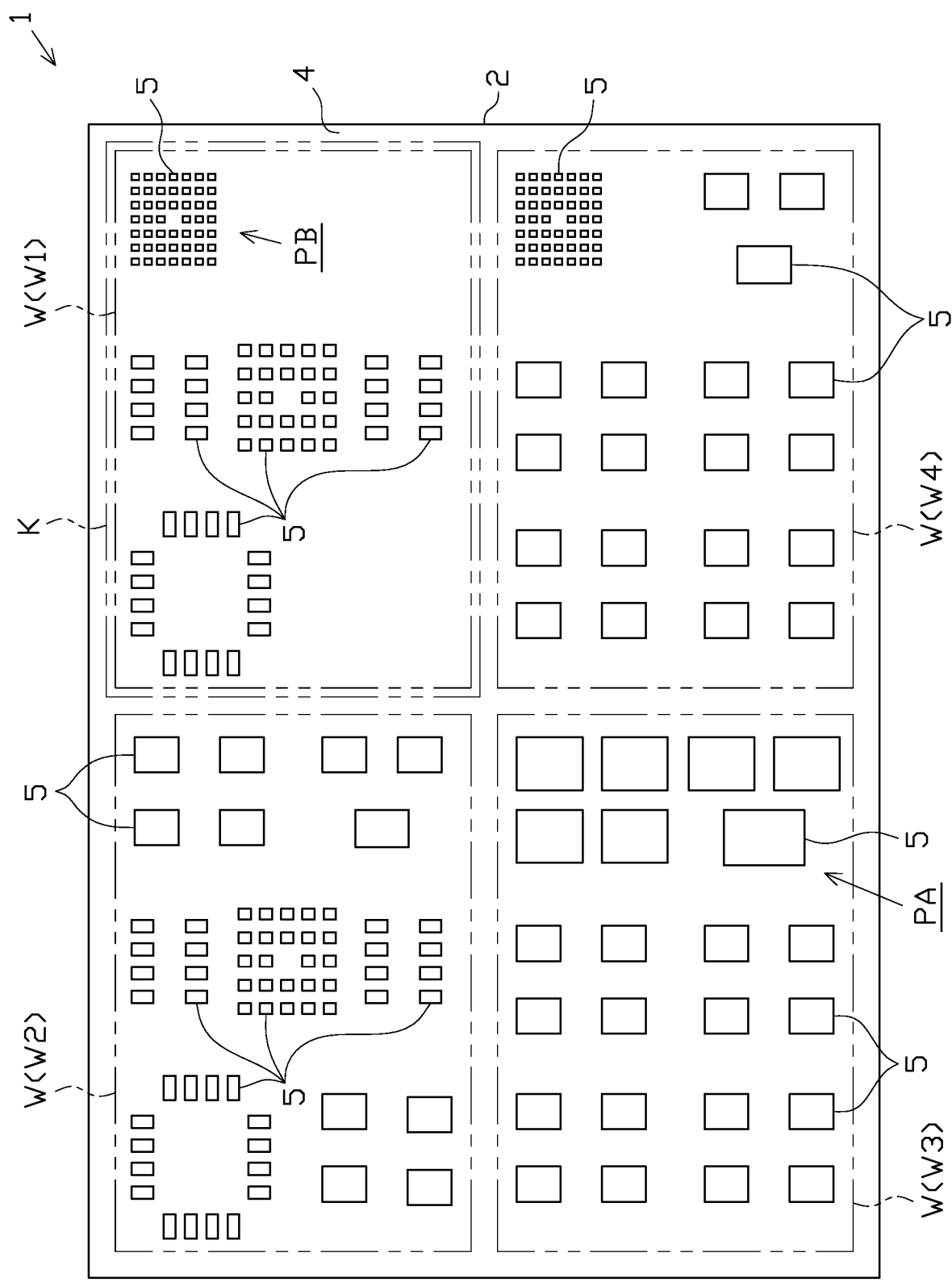
FIG. 3 is a schematic plan view illustrating the schematic configuration of the printed circuit board.

The following describes embodiments with reference to the drawings. First, the configuration of a printed circuit board 1 that is a measurement object according to one or more embodiments is described in detail (with referring to FIG. 2 and FIG. 3). FIG. 2 is a partially enlarged sectional view of the printed circuit board 1. FIG. 3 is a schematic plan view illustrating the schematic configuration of the printed circuit board 1.

As shown in FIG. 2 and FIG. 3, the printed circuit board 1 has an electrode pattern 3A and lands 3B that are made of copper foil and that are formed on a surface of a flat plate-like base board 2 made of a glass epoxy resin. Part of the surface of the base board 2 other than the lands 3B and peripheries thereof is coated with a resist film 4. Solder paste 5 that is a measurement target is printed (or applied) on the lands 3B.

The printed circuit board 1 according to one or more embodiments is, for example, an in-vehicle printed circuit board mounted on an electric vehicle and is configured to include both a power circuit portion PA, such as an inverter circuit, where electronic components with the flow of relatively high load current are mounted and a control circuit portion PB, such as a control circuit for controlling the power circuit portion PA, where electronic components with the flow of relatively low signal current are mounted.

Figure 1:
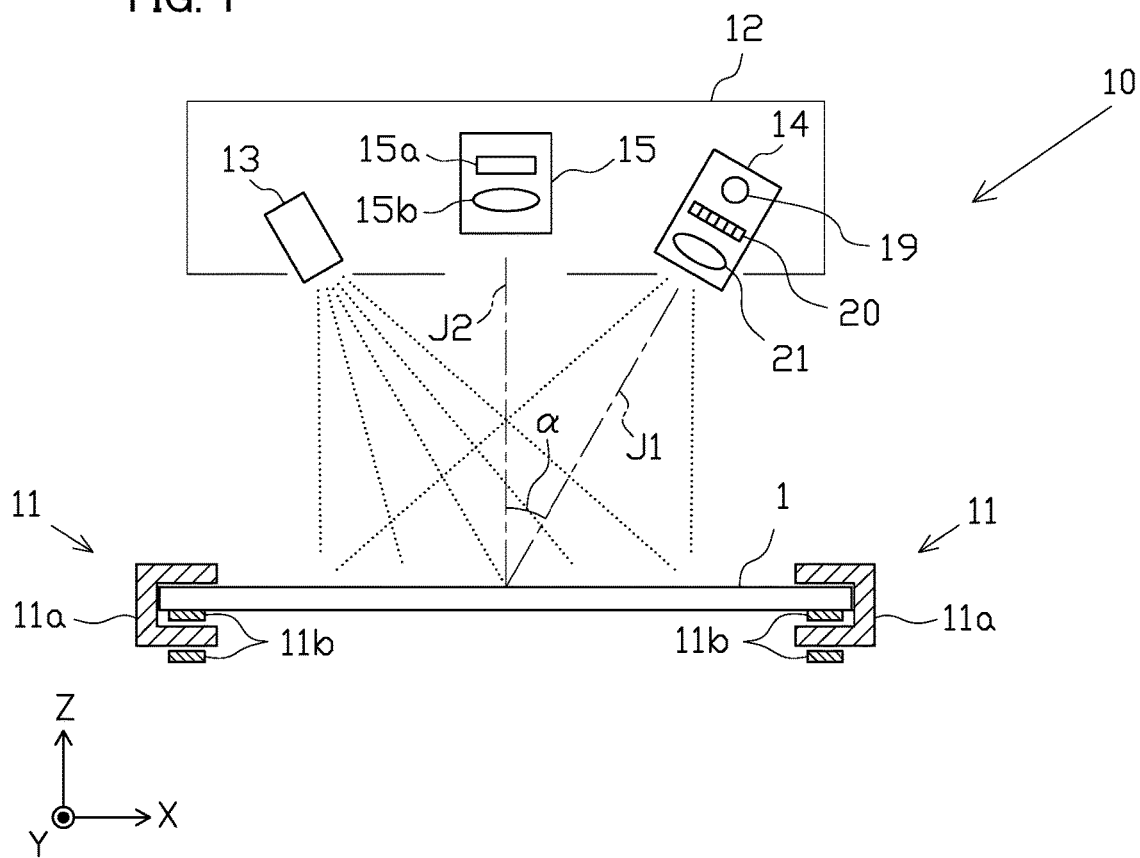
FIG. 1 is a schematic diagram illustrating the schematic configuration of a substrate inspection apparatus.

The following describes in detail a substrate inspection apparatus 10 that constitutes the three-dimensional measurement apparatus according to one or more embodiments (as shown in FIG. 1). FIG. 1 is a schematic diagram illustrating the schematic configuration of the substrate inspection apparatus 10. In the description below, a left-right direction of the sheet surface of FIG. 1 is specified as "X-axis direction", a front back direction of the sheet surface is specified as "Y-axis direction", and a top-bottom direction of the sheet surface (vertical direction) is specified as "Z-axis direction".

The substrate inspection apparatus 10 is a solder printing inspection apparatus configured to inspect the printing state of solder pastes 5 printed on the printed circuit board 1. The substrate inspection apparatus 10 includes a conveyance mechanism 11 configured to, for example, convey and position the printed circuit board 1; a measurement head 12 as the measurement module or the measurement device configured to perform measurement of the printed circuit board 1; and a control device 40 (shown in FIG. 4) configured to perform various controls in the substrate inspection apparatus 10, for example, drive controls of the conveyance mechanism 11 and the measurement head 12, image processing and arithmetic operations.

The conveyance mechanism 11 includes a pair of transfer rails 11a placed along a conveyance direction (Y-axis direction) of the printed circuit board 1; an endless conveyor belt 11b arranged to be rotatable relative to the respective transfer rails 11a; a drive unit (not shown), such as a motor, configured to drive the conveyor belt 11b; and a chuck mechanism (not shown) configured to position the printed circuit board 1 at a predetermined position. The conveyance mechanism 11 is driven and controlled by the control device 40.

The printed circuit board 1 carried into the substrate inspection apparatus 10 of the above configuration has respective ends in a width direction (X-axis direction) perpendicular to the conveyance direction, pressed into the transfer rails 11a, and is mounted on the conveyor belt 11b. The conveyor belt 11b then starts moving to transfer the printed circuit board 1 to a predetermined inspection position. When the printed circuit board 1 reaches the inspection position, the conveyor belt 11b stops, and the chuck mechanism is operated. This operation of the chuck mechanism presses up the conveyor belt 11b and causes the respective ends of the printed circuit board 1 to be held between the conveyor belt 11b and upper sides of the transfer rails 11a. This positions and fixes the printed circuit board 1 at the inspection position. When the inspection is terminated, the fixation by the chuck mechanism is released, and the conveyor belt 11b starts moving. The printed circuit board 1 is then carried out from the substrate inspection apparatus 10. The configuration of the conveyance mechanism 11 is, however, not limited to the above configuration, but another configuration may be employed.

The measurement head 12 is placed above a conveyance path of the printed circuit board 1 (above the pair of transfer rails 11a). The measurement head 12 includes an irradiation device 13 configured to irradiate a predetermined inspection range W (shown in FIG. 3) on the printed circuit board 1 obliquely downward with slit light (line light); a projection device 14 configured to project patterned light (hereinafter referred to as "fringe pattern") having a light intensity distribution in a fringe shape obliquely downward to the predetermined inspection range W; a camera 15 as the imaging unit configured to take an image of the inspection range W irradiated with the slit light or the inspection range W on which the fringe pattern is projected, from directly above the inspection range W; an X-axis moving mechanism 16 (shown in FIG. 4) configured to move the measurement head 12 in the X-axis direction; a Y-axis moving mechanism 17 (shown in FIG. 4) configured to move the measurement head 12 in the Y-axis direction; and a Z-axis moving mechanism 18 (shown in FIG. 4) configured to move the measurement head 12 in the Z-axis direction. The measurement head 12 is driven and controlled by the control device 40.

As shown in FIG. 3, the predetermined inspection range W on the printed circuit board 1 is one area among a plurality of areas (inspection ranges W1, W2, W3 and W4) set in advance on the printed circuit board 1 according to an imaging visual field (imaging range) K of the camera 15. Accordingly, the size of the inspection range W is approximately equal to the size of the imaging visual field K of the camera 15. The "inspection range W" corresponds to the "target measurement area" according to one or more embodiments.

The control device 40 drives and controls the X-axis moving mechanism 16 and the Y-axis moving mechanism 17 to move the measurement head 12 (imaging visual field K) to a position above any arbitrary inspection range W on the printed circuit board 1 that is positioned and fixed at the inspection position. The control device 40 is configured to perform an in-field-of-vision inspection process with regard to each inspection range W and thereby perform a solder printing inspection with regard to the whole area of the printed circuit board 1, while successively moving the measurement head 12 to the plurality of inspection ranges W1 to W4 set on the printed circuit board 1.

Furthermore, the control device 40 drives and controls the Z-axis moving mechanism 18 to change a relative height relationship between the measurement head 12 (the camera 15) and the printed circuit board 1. The Z-axis moving mechanism 18 and the function of the control device 40 to drive and control the Z-axis moving mechanism 18 configure the "height adjustment module" according to one or more embodiments.

The irradiation device 13 is known in the art, so that the detailed illustration thereof is omitted. The irradiation device 13 includes a light source configured to emit predetermined light, a converting portion configured to convert the light from the light source into slit light, and the like, and is driven and controlled by the control device 40. According to one or more embodiments, the irradiation device 13 is configured to irradiate the printed circuit board 1 obliquely downward with multiples lines of slight light that are parallel to the Y-axis direction. The "irradiation device 13" configures the "first irradiation unit" according to one or more embodiments, and the "slit light" corresponds to the "predetermined light for height measurement".

As shown in FIG. 1, the projection device 14 includes a light source 19 configured to emit predetermined light; a grid plate 20 configured to convert the light from the light source 19 into a fringe pattern; a projection lens unit 21 as a projection optical system configured to form an image of the fringe pattern generated by the grid plate 20, onto the printed circuit board 1; and a drive mechanism (not shown) such as a piezoelectric element, configured to slide and shift the grid plate 20 and shift the phase of the fringe pattern projected on the printed circuit board 1. The projection device 14 is driven and controlled by the control device 40.

The projection device 14 is arranged such that an optical axis J1 thereof is parallel to an X-Z plane and is inclined by a predetermined angle α (for example, 30 degrees) to the Z-axis direction. The "projection device 14" configures the "second irradiation unit" according to one or more embodiments, and the "fringe pattern" corresponds to the "predetermined patterned light for three-dimensional measurement".

The light source 19 is configured by a halogen lamp to emit white light. The light emitted from the light source 19 goes through a non-illustrated preprocessing lens group and the like to become parallel light and then enters in the state of parallel light along the optical axis J1 into the grid plate 20. The light source 19 may be configured by another light source, such as a white LED, in place of the halogen lamp.

The grid plate 20 is formed by printing (vapor deposition of) a non-illustrated grid pattern on a base member that is formed in a flat plate-like shape or in a film-like shape from a predetermined translucent material (for example, glass or an acrylic resin). The grid pattern includes light transmitting portions that are formed linearly along the Y-axis direction to transmit light at a predetermined transmission factor and light shielding portions that are formed linearly along the Y-axis direction to block at least part of light, and is configured to arrange the light transmitting portions and the light shielding portions alternately in the X-Z plane.

The projection lens unit 21 is configured by both-side telecentric lenses (both-side telecentric optical system) integrally provided with an incident-side lens and an emission-side lens. For the simplification, however, FIG. 1 illustrates the projection lens unit 21 as one lens.

The incident-side lens is configured to collect the light (fringe pattern) emitted from the grid plate 20 and has a telecentric structure where the principal ray is made parallel to the optical axis J1 on the incident side. The emission-side lens is configured to form an image of the light (fringe pattern) transmitted through the incident-side lens, onto the printed circuit board 1 and has a telecentric structure where the principal ray is made parallel to the optical axis J1 on the emission side.

In the projection device 14 according to one or more embodiments, the grid plate 20 is set to be inclined to the optical axis J1, such that the fringe pattern projected on the printed circuit board 1 is focused over the entire projection range (a range approximately identical with the imaging visual field K according to one or more embodiments), i.e., such that the grid plate 20 and a principal plane of the projection lens unit 21 are set to satisfy the Scheimpflug condition relative to the printed circuit board 1 (the illustration is simplified in FIG. 1).

In the projection device 14 of the above configuration, the light emitted from the light source 19 enters the grid plate 20. The light transmitted through the grid plate 20 is emitted in the form of a fringe pattern and is projected via the projection lens unit 21 onto the printed circuit board 1. The configuration of one or more embodiments accordingly causes the fringe pattern parallel to the conveyance direction (Y-axis direction) of the printed circuit board 1 to be projected.

The light passing through a lattice is generally not perfect parallel light but generates an intermediate gradation area on a boundary between a "bright portion" and a "dark portion" of the projected fringe pattern, due to the diffraction effect or the like on the boundary between the light transmitting portion and the light shielding portion. Accordingly, the fringe pattern projected on the printed circuit board 1 is patterned light having a light intensity distribution in a sinusoidal shape along the direction (X-axis direction) perpendicular to the conveyance direction (Y-axis direction) of the printed circuit board 1.

As shown in FIG. 1, the camera 15 includes an imaging element 15a having a light receiving face with a plurality of light receiving elements arranged two-dimensionally, and an imaging lens unit 15b as an imaging optical system configured to form an image in the imaging visual field K (the inspection range W of the printed circuit board 1 with the fringe pattern projected thereon), on the imaging element 15a. The camera 15 has an optical axis J2 that is set along the vertical direction (Z-axis direction) perpendicular to an upper face of the printed circuit board 1. According to one or more embodiments, a CCD area sensor is employed as the imaging element 15a.

The imaging lens unit 15b is configured by both-side telecentric lenses (both-side telecentric optical system) integrally provided with an object-side lens, an aperture diaphragm, an imaging-side lens and the like. For the simplification, however, FIG. 1 illustrates the imaging lens unit 15b as one lens.

The object-side lens is configured to collect the reflected light from the printed circuit board 1 and has a telecentric structure where the principal ray is made parallel to the optical axis J2 on the object side. The imaging-side lens is configured to form an image of the light emitted from the object-side lens and transmitted through the aperture diaphragm, onto the light receiving face of the imaging element 15a and has a telecentric structure where the principal ray is made parallel to the optical axis J2 on the imaging side.

The image data taken and obtained by the camera 15 is occasionally converted into a digital signal in the camera 15, is input in the form of the digital signal into the control device 40 and is stored in an image data storage device 44 described later. The control device 40 performs image processing, arithmetic operations, and the like described later, based on the image data.

Figure 4:
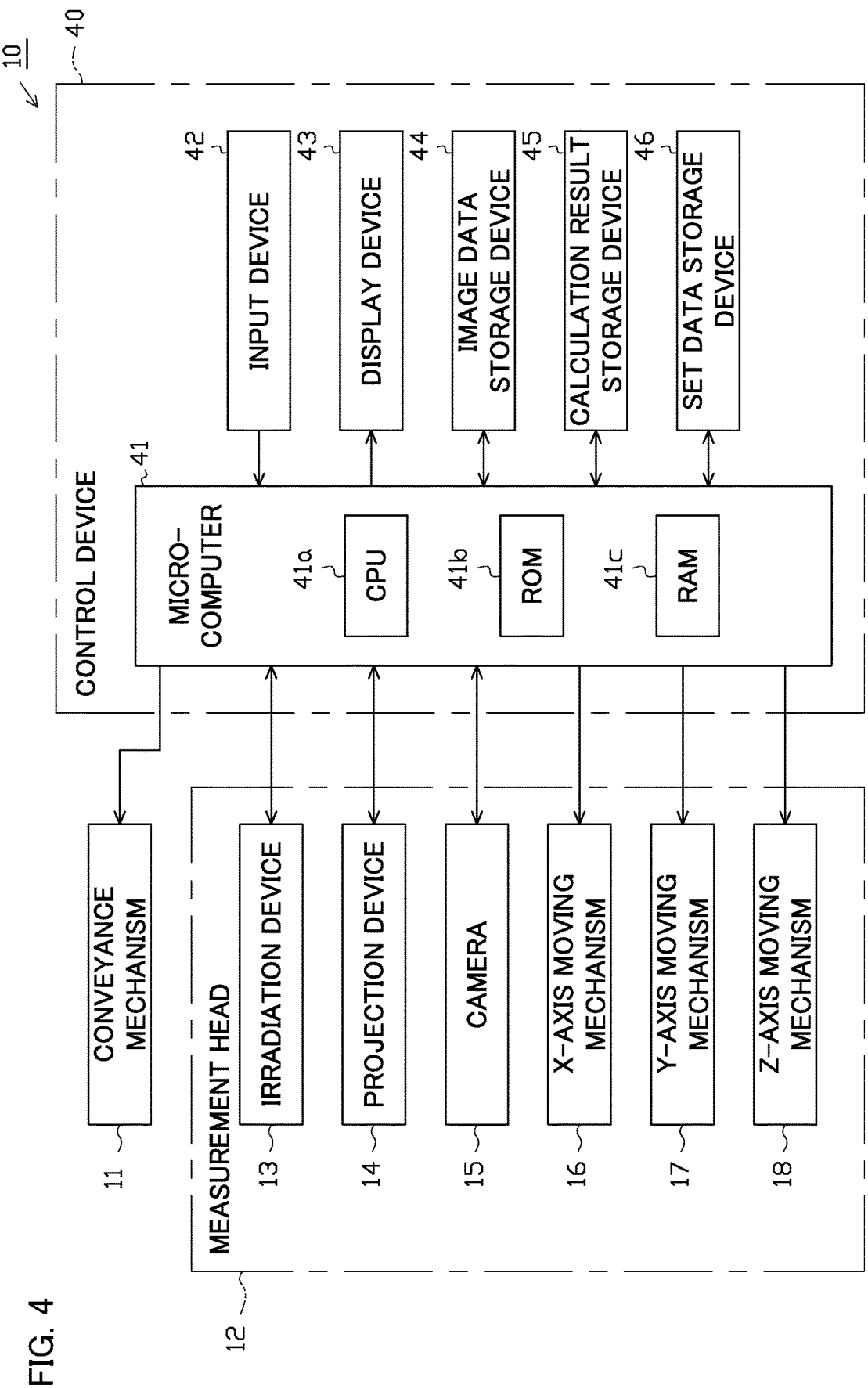
FIG. 4 is a block diagram illustrating the electrical configuration of the substrate inspection apparatus.

The following describes the electrical configuration of the control device 40 with reference to FIG. 4. FIG. 4 is a block diagram illustrating the electrical configuration of the substrate inspection apparatus 10.

As shown in FIG. 4, the control device 40 includes a microcomputer 41 configured to control the entire substrate inspection apparatus 10, an input device 42 configured by a keyboard and a mouse, by a touch panel or the like as an "input unit", a display device 43 configured as a "display unit" including a display screen such as a CRT or a liquid crystal screen, an image data storage device 44 configured to store image data and the like taken and obtained by the camera 15, a calculation result storage device 45 configured to store results of various calculations, for example, results of three-dimensional measurement obtained based on the image data, and a set data storage device 46 configured to store various information, such as Gerber data, in advance.

The microcomputer 41 includes a CPU 41a serving as an arithmetic device, a ROM 41b configured to store various programs, and a RAM 41c configured to temporarily store various data, such as calculation data and input/output data and is electrically connected with the respective devices 42 to 46 described above. The microcomputer 41 serves to control input and output of various data and signals to and from the respective devices 42 to 46.

The set data storage device 46 stores, for example, a plurality of inspection ranges W1 to W4 set on the printed circuit board 1 and information with regard to a moving sequence of the imaging visual field K of the camera 15 to these inspection ranges W1 to W4. The "moving sequence of the imaging visual field K" herein denotes in what order the imaging visual field K of the camera 15 is to be moved with regard to the plurality of inspection ranges W1 to W4 set on the printed circuit board 1.

The plurality of inspection ranges W (W1 to W4 according to one or more embodiments) with regard to the printed circuit board 1 and the moving sequence of the imaging visual field K to these inspection ranges W may be set in advance automatically by a predetermined program or manually by an operator, based on the Gerber data or the like.

For example, an illustrated example of FIG. 3 is set to start an inspection at the upper right inspection range W1 as the starting point and to perform the inspection with regard to the respective inspection ranges W, while moving the imaging visual field Kin the sequence of the "inspection range W1"→the "inspection range W2"→the "inspection range W3"→the "inspection range W4". This performs inspection with regard to the whole area of the printed circuit board 1.

The following describes an inspection routine of the printed circuit board 1 performed in the substrate inspection apparatus 10. This inspection routine is executed by the control device 40 (the microcomputer 41).

As described above, when the printed circuit board 1 carried into the substrate inspection apparatus 10 is positioned and fixed at a predetermined inspection position, the control device 40 first performs a position detection process of the printed circuit board 1.

More specifically, the control device 40 detects a positioning mark (not shown) provided on the printed circuit board 1 and calculates position information of the printed circuit board 1 (an inclination, a positional misalignment and the like), based on position information (coordinates) of the detected mark and position information (coordinates) of the mark stored in the Gerber data. This completes the position detection process of the printed circuit board 1. The control device 40 subsequently performs a correction process to correct a misalignment in a relative positional relationship between the measurement head 12 (the camera 15) and the printed circuit board 1, based on this position information of the printed circuit board 1.

The control device 40 subsequently performs a moving process that drives and controls the X-axis moving mechanism 16 and the Y-axis moving mechanism 17 to move the measurement head 12 to a position corresponding to the "first" inspection range W1 on the printed circuit board 1 according to an inspection sequence stored in the set data storage device 46.

When the moving process of the measurement head 12 is completed and the imaging visual field K of the camera 15 is adjusted to the "first" inspection range W1 on the printed circuit board 1, the control device 40 performs an in-field-of-vision inspection process with regard to the inspection range W1. The details of this in-field-of-vision inspection process will be described later (the same applies to the in-field-of-vision inspection process with regard to the other inspection ranges W2, W3 and W4).

On completion of the in-field-of-vision inspection process with regard to the "first" inspection range W1 on the printed circuit board 1, the control device 40 starts the moving process to move the measurement head 12 to a position corresponding to the "second" inspection range W2 on the printed circuit board 1 according to the inspection sequence stored in the set data storage device 46.

The control device 40 similarly performs the in-field-of-vision inspection process with regard to the "second" to the "fourth" inspection ranges W2 to W4 on the printed circuit board 1 to complete the solder printing inspection with regard to the entire printed circuit board 1.

Figure 5:
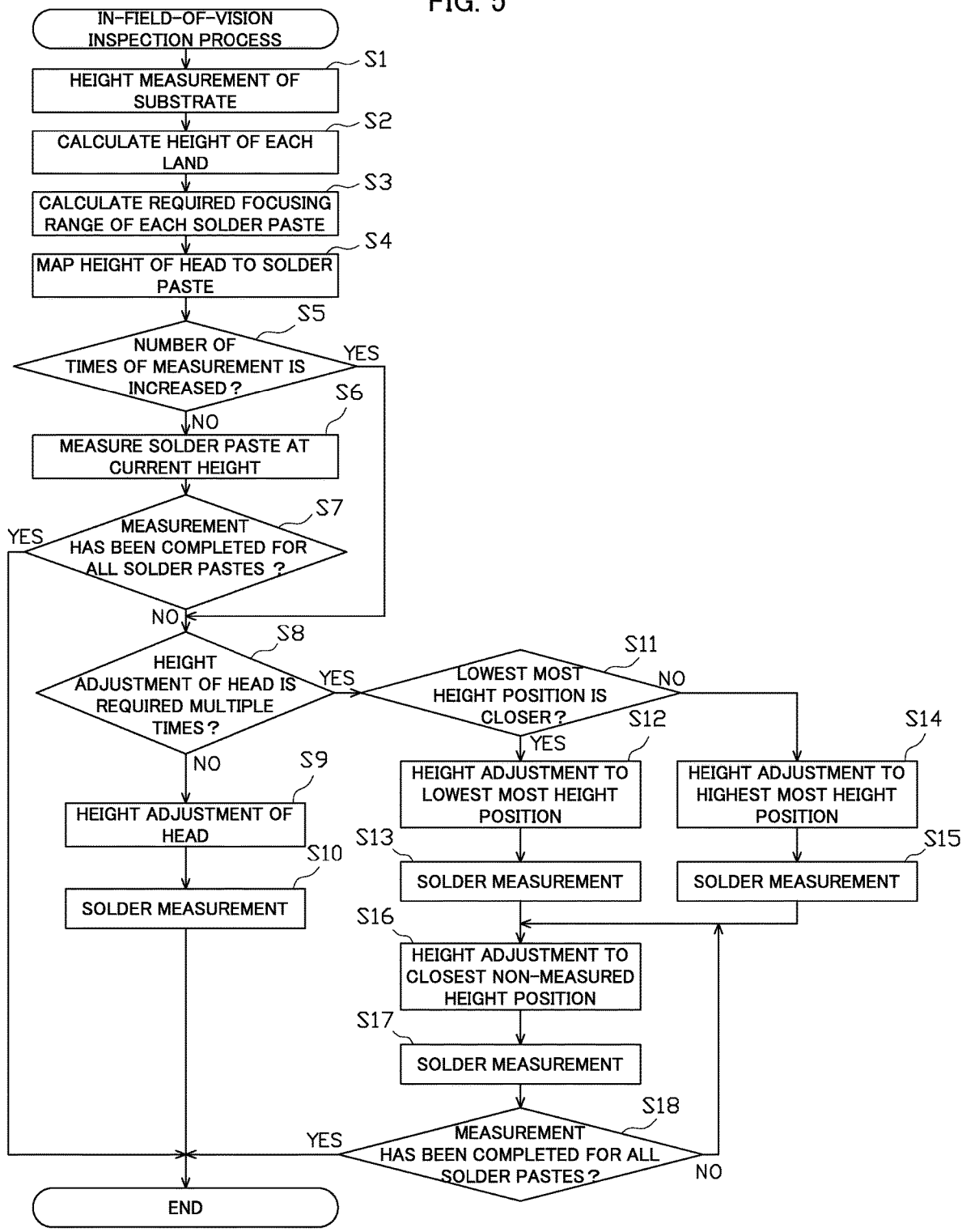
FIG. 5 is a flowchart showing a field-of-vision inspection process.

The in-field-of-vision inspection process performed with regard to each of the inspection ranges W on the printed circuit board 1 is described below in detail with reference to the flowchart of FIG. 5. This in-field-of-vision inspection process is executed by the control device 40 (the microcomputer 41).

The control device 40 first performs height measurement of the inspection range W at step S1. A height position in the inspection range W of the printed circuit board 1 is roughly measured by measuring the height positions of the surfaces of the lands 3B and the surface of the resist film 4 in the inspection range W. The process of step S1 corresponds to the "area height obtaining process" according to one or more embodiments, and the function of the control device 40 performing this process configures the "area height obtaining module".

More specifically, one or more embodiments perform height measurement by a known light section technique. The control device 40 drives the irradiation device 13 to irradiate the inspection range W obliquely downward with multiple lines of slit light that are parallel to each other and takes an image of the inspection range W with the camera 15. The control device 40 analyzes the image of slit light based on image data obtained by the camera 15 according to the principle of triangulation, so as to measure the height of the inspection range W (the printed circuit board 1). Height information (various information, such as the height, the warpage, and the inclination) obtained with regard to the inspection range W is stored in the calculation result storage device 45.

At step S2, the control device 40 subsequently calculates a height position of the surface of each land 3B that serves as a reference surface of each solder paste 5. The process of step S2 corresponds to the "reference surface height obtaining process" according to one or more embodiments, and the function of the control device 40 performing this process configures the "reference surface height obtaining module".

More specifically, according to one or more embodiments, the control device 40 roughly calculates height positions of the surfaces of all the lands 3B included in the inspection range W by taking into account various information, such as Gerver data, stored in advance in the set data storage device 46, based on the height information of the inspection range W obtained at step S1. The calculated height information of the surfaces of the respective lands 3B is stored in the calculation result storage device 45. The exactness is not required in the calculation of step S2. The height of the surface of the resist film 4 in the vicinity of the land 3B may thus be substituted as the height of the reference surface.

At step S3, the control device 40 subsequently calculates or specifies a required focusing range that is required for imaging an entire range in the height direction of each solder paste 5 in the focusing state, with regard to all the solder pastes 5 included in the inspection range W. The process of step S3 corresponds to the "required focusing range specification process" according to one or more embodiments, and the function of the control device 40 performing this process configures the "quired focusing range specification module".

More specifically, the control device 40 first sets the height position of the surface of each land 3B obtained at step S2 as a lower limit value in the required focusing range of the solder paste 5 printed on the land 3B. The control device 40 subsequently sets a value obtained by adding a height allowable maximum value T (shown in FIG. 6 and FIG. 7) of non-defective solder paste 5 stored in advance in the set data storage device 46 to this lower limit value, as an upper limit value in the required focusing range of each solder paste 5.

At step S4, the control device 40 subsequently maps the height position of the measurement head 12 to the solder paste 5 that is a measured target at the height position. The process of step S4 corresponds to the "mapping process" according to one or more embodiments, and the function of the control device 40 performing this process configures the "mapping module".

More specifically, the control device 40 performs the mapping, based on the required focusing range of each solder paste 5 obtained at step S3 and a depth of field of the camera 15 stored in advance in the set data storage device 46.

The mapping is described with reference to two examples shown in FIGS. 6 and 7. FIGS. 6 an 7 are schematic diagrams illustrating examples of a mapping relationship between the height position of the measurement head 12 and the solder paste 5 that is a measured target at the height position.

In FIG. 6 and FIG. 7, on the assumption that there are nine solder pastes 5 (solder pastes 5A to 5I) in a predetermined inspection range W, these nine solder pastes 5A to 5I are arranged at respective height positions with ignoring their positional relationship in a horizontal direction (X-Y plane).

In FIGS. 6 and 7, "Q0" denotes a depth of field when the measurement head 12 aligned to the inspection range W is at an "initial height position". Similarly, "Q1", "Q2", and "Q3" respectively denote depths of field when the measurement head 12 is at a "first height position", at a "second height position", and at a "third height position" in the Z-axis direction.

In the illustrated examples of FIGS. 6 and 7, the mapping is performed such as to allow four solder pastes 5A, 5B, 5C and 5D to be imaged and measured in the focusing state with the depth of field Q1 when the measurement head 12 is at the "first height position", to allow two solder pastes 5E and 5F to be imaged and measured in the focusing state with the depth of field Q2 when the measurement head 12 is at the "second height position", and to allow three solder pastes 5G, 5H and 5I to be imaged and measured in the focusing state with the depth of field Q3 when the measurement head 12 is at the "third height position".

At step S5, the control device 40 subsequently takes into account the result of the mapping performed at step S4 and determines whether the required number of times of "solder measurement (three-dimensional measurement of the solder paste 5 by using the phase shift method)" described later is increased in the inspection range W when the "solder measurement" is performed at the current height position of the measurement head 12, i.e., at the "initial height position" of the measurement head 12 aligned to the inspection range W.

The process of step S5 corresponds to the "frequency determination process" according to one or more embodiments, and the function of the control device 40 performing this process configures the "frequency determination module".

In the case of an affirmative determination, i.e., when it is determined that the number of times of "solder measurement" is increased, the control device 40 proceeds to step S8. In the case of a negative determination, i.e., when it is determined that the number of times of "solder measurement" is not increased, on the other hand, the control device 40 proceeds to step S6.

At step S6, the control device 40 performs a first "solder measurement" at the current height position (at the initial height position).

In the example of FIG. 6 (case 1), while the measurement head 12 is kept at the "initial height position", the solder pastes 5E and 5F are in such a state as to be imageable and measurable in the focusing state. In this case, the measurement head 12 performs "solder measurement (first solder measurement in this inspection range WV)" with regard to the solder pastes 5E and 5F that are present in the "depth of field Q0" at the "initial height position".

After that, in the example of FIG. 6 (case 1), the measurement head 12 may be moved to, for example, the "first height position" to perform "solder measurement (second solder measurement in this inspection range W)" with regard to the solder pastes 5A, 5B, 5C and 5D that are present in the "depth of field Q1" and may subsequently be moved to the "third height position" to perform "solder measurement (third solder measurement in this inspection range W)" with regard to the solder pastes 5G, 5H and 5I that are present in the "depth of field Q3".

In the example of FIG. 6 (case 1), this accordingly omits the operation process of moving the measurement head 12 to the "second height position" and decreases the frequency of moving in the Z-axis direction (the number of times of height adjustment) by one. In this case, according to one or more embodiments, a negative determination is made (it is determined that the number of times of "solder measurement" is not increased) at step S5.

In the example of FIG. 7 (case 2), on the other hand, while the measurement head 12 is kept at the "initial height position", three solder pastes 5C, 5D and 5E are in such a state as to be imageable and measurable in the focusing state.

In this case, it is assumed that the measurement head 12 performs "solder measurement (first solder measurement in this inspection range W)" with regard to the three solder pastes 5C, 5D and 5E that are present in the "depth of field Q0" at the "initial height position". The measurement head 12 is then moved to, for example, the "first height position" and performs "solder measurement (second solder measurement in this inspection range W)" with regard to the solder pasts 5A and 5B that are present in the "depth of field Q1". After that, however, the measurement head 12 is required to be moved to the "second height position" and to perform "solder measurement (third solder measurement in this inspection range W)" with regard to the solder paste 5F that is present in the "depth of field Q2) and is further required to be moved to the "third height position" and to perform "solder measurement (fourth solder measurement in this inspection range W)" with regard to the solder pastes 5G, 5H and 5I that are present in the "depth of field Q3". This increases the required number of times of "solder measurement" to four times.

In this case, according to one or more embodiments, an affirmative determination is made it is determined that the number of times of "solder measurement" is increased) at step S5. In the example of FIG. 7 (case 2), the process of step S5 causes the measurement head 12 to be moved to, for example, the "first height position" and to perform "solder measurement (first solder measurement in this inspection range W)" with regard to the solder pastes 5A, 5B, 5C and 5D that are present in the "depth of field Q1", without performing "solder measurement" with respect to the "depth of field Q0" at the "initial height position". The measurement head 12 is then moved to the "second height position" and performs "solder measurement (second solder measurement in this inspection range W)" with regard to the solder pastes 5E and 5F that are present in the "depth of field Q2". The measurement head 12 is further moved to the "third height position" and performs "solder measurement (third solder measurement in this inspection range W)" with regard to the solder pastes 5G, 5H and 5I that are present in the "depth of field Q3". Accordingly, the required number of times of "solder measurement" is three times.

At step S7 subsequent to step S6, the control device 40 determines whether "solder measurement" has been completed with regard to all the solder pastes 5 included in the inspection range W. More specifically, the control device 40 determines whether one "solder measurement" performed by the measurement head 12 in the "depth of field Q0" at the "initial height position" completes "solder measurement" with regard to all the solder pastes 5 in the inspection range W.

In the case of an affirmative determination, i.e., when "solder measurement" has been completed with regard to all the solder pastes in the inspection range W, the control device 40 terminates this process. In the case of a negative determination at step S7, i.e., when "solder measurement" has not yet been completed with regard to all the solder pastes in the inspection range W, on the other hand, the control device 40 proceeds to step S8.

At step S8, the control device 40 determines whether height adjustment of the measurement head 12 is required multiple times for measurement of unmeasured solder pastes 5.

In the case of an affirmative determination, i.e., when height adjustment of the measurement head 12 is required multiple times, the control device 40 proceeds to step S11. In the case of a negative determination, i.e., when height adjustment of the measurement head 12 is required only once, on the other hand, the control device 40 proceeds to step S9.

At step S9, the control device 40 drives and controls the Z-axis moving mechanism 18 to move the measurement head 12 to a predetermined height position and position the measurement head 12 at the predetermined height position. At subsequent step S10, the control device 40 performs "solder measurement" with regard to unmeasured solder pastes 5 at this height position and then terminates this process. The details of "solder measurement" will be described later.

The process of step S9 (the same applies to steps S12, S14 and S16 described later) corresponds to the "height adjustment process" according to one or more embodiments, and the function of the control device 40 performing this process configures the "height adjustment module". The process (solder measurement) of step S10 (the same applies to steps S13, S15 and S17 described later) corresponds to the "three-dimensional measurement process" according to one or more embodiments, and the function of the control device 40 performing this process configures the "three-dimensional measurement module".

At step S11 which the control device 40 proceeds to in response to an affirmative determination at step S8, on the other hand, the control device 40 determines whether a moving distance of the measurement head 12 from the current height position of the measurement head 12, i.e., from the "initial height position" of the measurement head 12 aligned to the inspection range W, to a height position located lowest most (lowest most height position) among a plurality of height positions of the measurement head 12 determined by the mapping at step S4 described above, is shorter than a moving distance of the measurement head 12 from the current height position of the measurement head 12 to a height position located highest most (highest most height position).

The moving distance of the measurement head 12 successively moved up in the Z-axis direction from the lowest most height position to each of the plurality of height positions determined by the mapping is equal to the moving distance of the measurement head 12 successively moved down in the Z-axis direction from the highest most height position. Accordingly, moving to the height position having the shorter moving distance from the "initial height position" between the lowest most height position and the highest most height position shortens the sum of moving distances (total moving distance) of the measurement head 12 that moves until completion of "solder measurement" with regard to all the solder pastes 5 in the inspection range W.

The process of step S11 corresponds to the "distance determination process" according to one or more embodiments, and the function of the control device 40 performing this process configures the "distance determination module".

In the case of an affirmative determination, i.e., when it is determined that the moving distance of the measurement head 12 to the lowest most height position is shorter, the control device 40 proceeds to step S12.

The control device 40 drives and controls the Z-axis moving mechanism 18 to move the measurement head 12 to the lowest most height position and position the measurement head 12 at this lowest most height position at step S12 and performs "solder measurement" at this lowest most height position at subsequent step S13. The control device 40 subsequently proceeds to step S16.

In the case of a negative determination at step S11, i.e., when it is determined that the moving distance of the measurement head 12 to the highest most height position is shorter, the control device proceeds to step S14.

The control device 40 drives and controls the Z-axis moving mechanism 18 to move the measurement head 12 to the highest most height position and position the measurement head 12 at this highest most height position at step S14 and performs "solder measurement" at this highest most height position at subsequent step S15. The control device 40 subsequently proceeds to step S16.

In both the examples of FIGS. 6 and 7 (in both the cases 1 and 2), the measurement head 12 is moved to the "first height position" that is closer to the "initial height position" and performs "solder measurement" with respect to the "depth of field Q1".

It is here assumed that the measurement head 12 is moved to the "third height position" that is farther from the "initial height position" and performs "solder measurement" with respect to the "depth of field Q3". This increases the total moving distance of the measurement head 12 that moves until completion of "solder measurement" with regard to all the solder pastes 5 in the inspection range W.

The control device 40 drives and controls the Z-axis moving mechanism 18 to move the measurement head 12 to a non-measured height position closest most from the current height position and position the measurement head 12 at this height position at step S16 and performs "solder measurement" at this height position at subsequent step S17. The control device 40 subsequently proceeds to step S18.

At step S18, the control device 40 determines whether "solder measurement" has been completed with regard to all the solder pastes 5 in the inspection range W. In the case of an affirmative determination, i.e., when "solder measurement" has been completed with regard to all the solder pastes 5 in the inspection range W, the control device 40 terminates this process.

In the case of a negative determination at step S18, i.e., when "solder measurement" has not yet been completed with regard to all the solder pastes 5 in the inspection range W, on the other hand, the control device 40 repeats the series of processing described above until completion of "solder measurement" with regard to all the solder pastes 5 in the inspection range W.

The following describes in detail the "solder measurement (three-dimensional measurement of the solder paste 5 by using the phase shift method)" performed at step S10 and other steps described above.

The procedure of "solder measurement" according to one or more embodiments performs the imaging process with regard to the inspection range W four times with fringe patterns having different phases, while changing the phase of the fringe pattern projected from the projection device 14. The procedure accordingly obtains four different image data having different light intensity distributions. This procedure is described in detail below.

As described above, after completion of height adjustment of the measurement head 12 in a predetermined inspection range W, the control device 40 first slides and shifts the grid plate 20 of the projection device 14 to set the position of a grid pattern formed in the grid plate 20 to a predetermined reference position (for example, the position of a phase "0 degree").

After completion of positioning of the grid plate 20, the control device 40 turns on the light source 19 of the projection device 14 to project a predetermined fringe pattern and drives and controls the camera 15 to perform a first imaging process under the predetermined fringe pattern.

After that, simultaneously with termination of the first imaging process under the predetermined fringe pattern, the control device 40 turns off the light source 19 and slides and shifts the grid plate 20. More specifically, the control device 40 slides and shifts the position of the grid pattern formed in the grid plate 20 from the reference position to a second position having the phase of the fringe pattern shifted by ¼ pitch (90 degrees).

After completion of sliding and shifting the grid plate 20, the control device 40 turns on the light source 19 to project a predetermined fringe pattern and drives and controls the camera 15 to perform a second imaging process under the predetermined fringe pattern.

After that, the control device 40 repeats a similar series of processing to obtain four different image data having different light intensity distributions under fringe patterns having different phases by 90 degrees each (by ¼ pitch each). Accordingly, the control device 40 obtains four different image data where the phase of the fringe pattern having a light intensity distribution in a sinusoidal shape is shifted by 90 degrees each.

The control device 40 subsequently performs three-dimensional measurement (height measurement at each coordinate position) with regard to each solder paste 5 that is a measured target at a predetermined height position, based on four different image data obtained as described above with respect to the predetermined height position (four different luminance values at each coordinate position) by a known phase shift method. The results of this three-dimensional measurement are stored in the calculation result storage device 45.

The known phase shift method is described below. Light intensities (luminance values) I0, I1, I2 and I3 of the four different image data described above at a predetermined coordinate position on the printed circuit board 1 are respectively expressed by Expressions (1), (2), (3) and (4) given below:

$$I0 = \alpha \sin\theta + \beta \qquad (1)$$

$$I1 = \alpha \sin(\theta + 90°) + \beta = \alpha\cos\theta + \beta \qquad (2)$$

$$I2 = \alpha \sin(\theta + 180°) + \beta = -\alpha\cos\theta + \beta \qquad (3)$$

$$I3 = \alpha \sin(\theta + 270°) + \beta = -\alpha\cos\theta + \beta \qquad (4)$$

where $\alpha$ denotes a gain, $\beta$ denotes an offset, and $\theta$ denotes a phase of the fringe pattern.

Solving Expressions (1), (2), (3) and (4) given above with respect to the phase θ provides Expression (5) given below:

$$\theta = \tan^{-1}\{(I0-I2)/(I1-I3)\} \quad (5)$$

Using the phase θ calculated as described above enables the height (Z) at each coordinate position (X,Y) on the printed circuit board 1 to be determined, based on the principle of triangulation.

The control device 40 subsequently performs a good/poor quality judgment process of the printing state of each solder paste 5, based on the results of the three-dimensional measurement (height data at each coordinate position) obtained as described above. More specifically, the control device 40 detects a printing range of each solder paste 5 that is higher by a predetermined length or more than a reference value determined for each land 3B (a land for the power circuit portion PA or a land for the control circuit portion PB), based on the measurement result of the solder paste 5 obtained as described above, and integrates the heights at respective locations in this detected range to calculate the printing amount of the solder paste 5.

The control device 40 subsequently compares data, such as the position, the area, and the height or the amount of each solder paste 5 determined as described above with reference data (for example, Gerber data) stored in advance in the set data storage device 46 and determines whether the printing state of the solder paste 5 is good or poor based on whether the result of this comparison is in an allowable range. The results of good/poor judgment of the respective solder pastes 5 are stored in the calculation result storage device 45.

When the "solder measurement (including the good/poor quality judgment)" has been completed with regard to all the solder pastes 5 in the inspection range W and the in-field-of-vision inspection process is terminated with regard to the inspection range W, the control device 40 moves the measurement head 12 to a next inspection range W. After that, the above series of processing is repeatedly performed with regard to all the inspection ranges W1 to S4 on the printed circuit board 1. This terminates the solder printing inspection with regard to the entire printed circuit board 1.

As described above in detail, one or more embodiments are configured to perform height adjustment of the measurement head 12 in the process of performing three-dimensional measurement of each solder paste 5 (solder measurement) in a predetermined inspection range W on the printed circuit board 1.

More specifically, the configuration of one or more embodiments irradiates an inspection range W with slit light from the irradiation device 13 and measures the height of the inspection range W. The configuration of one or more embodiments subsequently determines the height of the surface of each land 3B that serves as a reference surface of each of solder pastes 5 included in the inspection range W, based on this height information of the inspection range W, and specifies a required focusing range that is required for imaging the entire range in the height direction of each solder paste 5 in the focusing state.

The configuration of one or more embodiments subsequently maps the height position of the measurement head 12 to each solder paste 5 that is a measured target at the height position, based on the required focusing ranges of the respective solder pastes 5 and the depth of field of the camera 15. The configuration of one or more embodiments successively moves the measurement head 12 to a predetermined height position determined by the mapping and performs solder measurement with regard to each solder paste 5 that is a measured target at the height position.

This configuration enables three-dimensional measurement to be performed by using image data taken in the appropriate focusing state with regard to all the solder pastes 5 included in one inspection range W (in a height range from the solder paste 5 located at the lowest most position to the solder paste 5 located at the highest most position). As a result, this achieves improvement of the measurement accuracy and the like.

Furthermore, in the process of mapping the height position of the measurement head 12 to each solder paste 5 that is a measured target at the height position (step S4), one or more embodiments are configured to perform the mapping such that there is at least one depth of field of the camera 15 including an entire required focusing range of each of the plurality of solder pastes 5 in the illustrated example of FIGS. 6 and 7.

This configuration enables three-dimensional measurement (solder measurement) to be performed with regard to the entirety in the height direction of the solder paste 5 simultaneously at least once without dividing the solder paste 5 in the height direction. This achieves improvement of the measurement accuracy.

Moreover, one or more embodiments are configured to determine whether the required number of times of "solder measurement" in an inspection range W is increased or not when the "solder measurement" is performed at the "initial height position" of the measurement head 12 aligned to the inspection range W (step S5) and performs first "solder measurement" at the "initial height position" (step S6) when it is determined that the number of times of "solder measurement" is not increased.

This configuration decreases the moving frequency in the height direction of the measurement head 12 (the number of times of height adjustment) by one. This accordingly shortens the total measurement time with regard to one inspection range W.

Additionally, in the case where height adjustment is required multiple times from the "initial height position" of the measurement head 12 aligned to the inspection range W (step S8), one or more embodiments are configured to determine which is shorter between the moving distance of the measurement head 12 to the lowest most height position among the plurality of height positions as the moving destination and the moving distance to the highest most height position (step S11) and to move the measurement head 12 to the height position of the shorter distance (steps S12 and S14).

This configuration shortens the required total moving distance in the height direction until completion of measurement of all the solder pastes 5 included in one inspection range W. As a result, this shortens the total measurement time with regard to one inspection range W.

The present invention is not limited to the description of the above embodiments but may also be implemented, for example, by configurations described below. The present invention may further be implemented by other applications and other modifications that are not specifically described below.

(a) The above embodiments describe the application of the three-dimensional measurement apparatus to the substrate inspection apparatus 10 (solder printing inspection apparatus) configured to inspect the printing state of the solder pastes 5 printed on the printed circuit board 1. The present invention is, however, not limited to this application but may be applied to an apparatus configured to inspect another object, for example, an electronic component mounted on a printed circuit board. A modification may be configured to perform three-dimensional measurement of an object that is different from a substrate, as the measurement object.

(b) The above embodiments are configured to set the four inspection ranges W1 to W4 on the printed circuit board 1 as the target measurement area, according to the imaging visual field K of the camera 15. The setting of the target measurement area is not limited to this configuration. For example, the entire area of the printed circuit board 1 may be set as one target measurement area.

The above embodiments are configured to perform inspection of the entire area of the printed circuit board 1 by successively moving the measurement head 12 in the X-axis direction and the Y-axis direction to the four inspection ranges W1 to W4 on the printed circuit board 1 fixed at the predetermined position. This configuration is, however, not essential. A modified configuration may perform inspection of the entire area of the printed circuit board 1 by moving the printed circuit board 1 in the X-axis direction and the Y-axis direction in the state that the measurement head 12 is fixed in the X-axis direction and the Y-axis direction.

(c) The above embodiments are configured to obtain the four different image data with the fringe patterns having different phases by 90 degrees each in the process of performing three-dimensional measurement (solder measurement) by the phase shift method. Neither the number of times of phase shift nor the amount of phase shift is limited to this configuration. Another number of times of phase shift and another amount of phase shift that allow for three-dimensional measurement by the phase shift method may also be employed.

For example, a modification may be configured to obtain three different image data having different phases by 120 degrees (or 90 degrees) each and perform three-dimensional measurement. In another example, a modification may be configured to obtain two different image data having different phases by 180 degrees (or 90 degrees) each and perform three-dimensional measurement.

(d) The above embodiments are configured to project the patterned light having the light intensity distribution in the sinusoidal shape in the process of performing three-dimensional measurement by the phase shift method. This configuration is, however, not essential. A modification may be configured to project patterned light having a light intensity distribution in a non-sinusoidal shape, such as a rectangular wave shape or a triangular wave shape.

Three-dimensional measurement with projection of the patterned light having the light intensity distribution in the sinusoidal shape, however, has the higher measurement accuracy than three-dimensional measurement with projection of the patterned light having the light intensity distribution in the non-sinusoidal shape. Accordingly, in terms of improving the measurement accuracy, it is possible to employ the configuration of performing the three-dimensional measurement with projection of the patterned light having the light intensity distribution in the sinusoidal shape.

(e) The above embodiments are configured to project the fringe pattern onto the printed circuit board 1 and perform three-dimensional measurement with regard to the solder pastes 5 by the phase shift method. This configuration is, however, not essential. A modification may be configured to perform three-dimensional measurement by another three-dimensional measurement technique (pattern projection method), for example, a space coding method or a moire method. In the case of measurement of a small measurement target, such as the solder paste 5 however, it is possible to employ a measurement technique of the high measurement accuracy, such as the phase shift method.

(f) The above embodiments are configured to irradiate the printed circuit board 1 with slit light and perform height measurement of the inspection range W (the printed circuit board 1) by the light section technique. The method of height measurement of the inspection range W is, however, not limited to this configuration.

Another measurement technique different from the light section technique may be employed for height measurement; for example, a laser pointer may be radiated from the irradiation device 13 or patterned light having a longer period of fringes (more sparse fringes) than that of the fringe pattern projected by the projection device 14 (patterned light for three-dimensional measurement of the solder paste 5).

(g) The configuration of the second irradiation unit (projection unit) to radiate patterned light for three-dimensional measurement is not limited to the configuration of the above embodiments.

For example, the projection device 14 of the above embodiments is configured to use the grid plate 20 as a conversion unit to convert light from the light source 19 into a fringe pattern. A modified configuration may use a liquid crystal optical shutter or the like for the conversion unit.

The projection lens unit 21 of the projection device 14 is configured by the both-side telecentric lenses (both-side telecentric optical system) integrally provided with the incident-side lens and the emission-side lens. This configuration is, however, not essential. Object-side telecentric lenses (object-side telecentric optical system) may be employed for the projection lens unit 21. The projection lens unit 21 may be configured by a non-telecentric structure.

Furthermore, in the projection device 14 according to one or more embodiments, the grid plate 20 and the principal plane of the projection lens unit 21 are set to satisfy the Scheimpflug condition relative to the printed circuit board 1. This configuration is, however, not essential. The grid plate 20 and the principal plane of the projection lens unit 21 may not be necessarily set to satisfy the Scheimpflug condition, depending on the focusing state of the fringe pattern in an entire projection range.

(h) The imaging unit is not limited to the camera 15 of the above embodiments. For example, according to the above embodiments, a CCD area sensor is employed as the imaging element 15a. This configuration is, however, not essential. For example, a CMOS area sensor or the like may be employed as the imaging element 15a.

The imaging lens unit 15b is configured by the both-side telecentric lenses (both-side telecentric optical system). This configuration is, however, not essential. Object-side telecentric lenses (object-side telecentric optical system) may be employed as the imaging lens unit 15b. The imaging lens unit 15b may be configured by a non-telecentric structure.

(i) In the process of mapping the height position of the measurement head 12 to each solder paste 5 that is a measured target at the height position (step S4), the above embodiments are configured to perform the mapping such that there is at least one depth of field of the camera 15 including an entire required focusing range of each of the plurality of solder pastes 5 in the illustrated example of FIGS. 6 and 7. The mapping method is, however, not limited to this configuration.

For example, a modification may be configured to set the height position of the measurement head 12 to be positioned such as not to overlap the depth of field of the camera 15 in a height range including all the solder pastes 5 in the inspection range W (in a height range from a lower limit of the required focusing range of the solder paste 5 located at the lowest most position to an upper limit of the required focusing range of the solder paste 5 located at the highest most position).

In this modified configuration, at some height position of the measurement head 12, no solder paste 5 may be included in the depth of field of the camera 15. In this case, the modification may be configured not to stop the measurement head 12 and not to perform three-dimensional measurement (solder measurement) at this height position.

Moreover, in this modified configuration, in some cases, multiple locations in the height direction of one solder paste 5 may be measured by three-dimensional measurement (solder measurement) at different height positions. With a view to suppressing reduction of the measurement accuracy, the method described in the above embodiments can be used.

(j) The above embodiments are configured to determine whether the required number of times of "solder measurement" in an inspection range W is increased or not when the "solder measurement" is performed at the "initial height position" of the measurement head 12 aligned to the inspection range W (step S5) and performs first "solder measurement" at the "initial height position" (step S6) when it is determined that the number of times of "solder measurement" is not increased.

The moving sequence of the measurement head 12 (the measurement procedure) is, however, not limited to this configuration. For example, a modification may be configured to move the measurement head 12 from the "initial height position of the measurement head 12 aligned to the inspection range W to the lowest most height position or the highest most height position among the plurality of height positions determined by the mapping (step S4) and perform first "solder measurement", without performing the determination process and the like described above (steps S5 and S6).

(k) In the case where height adjustment is required multiple times from the "initial height position" of the measurement head 12 aligned to the inspection range W (step S8), the above embodiments are configured to determine which is shorter between the moving distance of the measurement head 12 to the lowest most height position among the plurality of height positions as the moving destination and the moving distance to the highest most height position (step S11) and to move the measurement head 12 to the height position of the shorter distance (steps S12 and S14).

The moving sequence of the measurement head 12 (the measurement procedure) is, however, not limited to this configuration. For example, a modification may be configured to move the measurement head 12 from the "initial height position" to the lowest most height position or the highest most height position that has the larger moving distance from the "initial height position".

(l) The above embodiments are configured to move the whole measurement head 12 in the Z-axis direction by the Z-axis moving mechanism 18. According to a modification, however, in the measurement head 12, the camera 15 may be configured to be movable relative to the irradiation device 13 and the projection device 14 and the camera 15 alone may be moved in the Z-axis direction. In this modification, the mapping (step S4) may be performed with regard to a relationship between the height position of the camera 15 and each solder paste 5 that is a measured target at the height position.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

1 . . . printed circuit board, 3B . . . land, 4 . . . resist film, 5 . . . solder paste, 10 . . . substrate inspection apparatus, 12 . . . measurement head, 13 . . . irradiation device, 14 . . . projection device, 15 . . . camera, 15a . . . imaging element, 18 . . . Z-axis moving mechanism, 40 . . . control device, 44 . . . image data storage device, 45 . . . calculation result storage device, 46 . . . set data storage device, K . . . imaging visual field, Q0-Q3 . . . depths of field, W (W1-W4) . . . inspection range

What is claimed is:

1. A three-dimensional measurement apparatus that measures a plurality of measurement targets placed in a target measurement area on a measurement object by a predetermined three-dimensional measurement technique, the three-dimensional measurement apparatus comprising:
    a measurement module that:
        is positioned with respect to the target measurement area, and comprises:
            a first irradiator that irradiates the target measurement area with predetermined light for height measurement of the measurement object within the target measurement area;
            a second irradiator that irradiates the target measurement area with predetermined patterned light for three-dimensional measurement of the measurement targets; and
            an imaging device that takes an image of the target measurement area irradiated with either the predetermined light or the predetermined patterned light; and
    a control device that:
        obtains, based on image data taken by the imaging device when the target measurement area is irradiated with the predetermined light, target height information on the measurement object within target measurement area;
        calculates, based on the target height information, reference height information on a reference surface of each of the measurement targets within the target measurement area;
        specifies, based on the reference height information and with respect to each of the measurement targets, a required focusing range for imaging an entire range in a height direction of each of the measurement targets in a focusing state;
        maps, based on the required focusing range and a field of depth of the imaging device, a height position of the measurement module to each of the measurement targets at the height position;

moves the measurement module in the height direction and successively positions the measurement module at a predetermined height position determined by the mapping; and performs, based on image data taken by the imaging device under the predetermined patterned light, three-dimensional measurement to the measurement targets at the predetermined height position.

2. The three-dimensional measurement apparatus according to claim 1, wherein before moving the measurement module in the height direction, the control device determines whether a required number of times of the three-dimensional measurement in the target measurement area increases by performing the three-dimensional measurement at an initial height position of the measurement module, and when the required number of times of the three-dimensional measurement does not increase, the control device performs an initial three-dimensional measurement at the initial height position.

3. The three-dimensional measurement apparatus according to claim 1, wherein the control device further:

in the case of moving the measurement module in the height direction, determines which is shorter between a moving distance from an initial height position of the measurement module to a lower most height position and to an upper most height position among a plurality of height positions of the measurement module determined by the mapping, and moves the measurement module from the initial height position to the lower most height position or the upper most height position at which the moving distance becomes shorter.

4. The three-dimensional measurement apparatus according to claim 2, wherein the control device further:

in the case of moving the measurement module in the height direction, determines which is shorter between a moving distance from the initial height position to a lower most height position and to an upper most height position among a plurality of height positions of the measurement module determined by the mapping, and moves the measurement module from the initial height position to the lower most height position or the upper most height position at which the moving distance becomes shorter.

5. The three-dimensional measurement apparatus according to claim 1, wherein the control device maps the height position of the measurement module to each of the measurement targets such that at least one field of depth of the imaging device includes an entire required focusing range of the measurement targets.

6. The three-dimensional measurement apparatus according to claim 2, wherein the control device maps the height position of the measurement module to each of the measurement targets such that at least one field of depth of the imaging device includes an entire required focusing range of the measurement targets.

7. The three-dimensional measurement apparatus according to claim 3, wherein the control device maps the height position of the measurement module to each of the measurement targets such that at least one field of depth of the imaging device includes an entire required focusing range of the measurement targets.

8. The three-dimensional measurement apparatus according to claim 4, wherein the control device maps the height position of the measurement module to each of the measurement targets such that at least one field of depth of the imaging device includes an entire required focusing range of the measurement targets.

9. A three-dimensional measurement method using a measurement module that includes an irradiator and an imaging device and that is positioned with respect to a target measurement area on a measured object and performing three-dimensional measurement to a plurality of measurement targets placed in the target measurement area by a predetermined three-dimensional measurement technique, the method comprising:

obtaining, based on image data taken by irradiating the target measurement area with predetermined light, target height information on the measurement object within the target measurement area;

calculating, based on the target height information, reference height information on a reference surface of each of the measurement targets within the target measurement area;

specifying, based on the reference height information and with respect to each of the measurement targets, a required focusing range for imaging an entire range in a height direction of each of the measurement targets in a focusing state;

mapping, based on the required focusing range and a field of depth of the imaging device, a height position of the measurement module to each of the measurement targets at the height position;

moving the measurement module in the height direction and of successively positioning the measurement module at a predetermined height position determined by the mapping; and a three-dimensional measurement process of performing, based on image data taken by irradiating the target measurement area with predetermined patterned light, three-dimensional measurement to the measurement targets at the predetermined height position.

10. The three-dimensional measurement method according to claim 9, further comprising:

before moving the measurement module in the height direction, determining whether a required number of times of the three-dimensional measurement in the target measurement area increases by performing the three-dimensional measurement at an initial height position of the measurement module, wherein the performing includes, when the required number of times of the three-dimensional measurement does not increase, performing an initial three-dimensional measurement at the initial height position.

11. The three-dimensional measurement method according to claim 9, further comprising:

in the case of moving the measurement module in the height direction, determining which is shorter between a moving distance from an initial height position of the measurement module to a lower most height position and to an upper most height position among a plurality of height positions of the measurement module determined by the mapping, wherein the moving includes moving the measurement module from the initial height position to the lower most height position or the upper most height position at which the moving distance becomes shorter.

12. The three-dimensional measurement method according to claim 10, further comprising:
in the case of moving the measurement module in the height direction, determining which is shorter between a moving distance from the initial height position to a lower most height position and to an upper most height position among a plurality of height positions of the measurement module determined by the mapping, wherein
the moving includes moving the measurement module from the initial height position to the lower most height position or the upper most height position at which the moving distance becomes shorter.

13. The three-dimensional measurement method according to claim 9, wherein
the mapping includes mapping the height position of the measurement module to each of the measurement targets such that at least one field of depth of the imaging device includes an entire required focusing range of the measurement targets.

14. The three-dimensional measurement method according to claim 10, wherein
the mapping includes mapping the height position of the measurement module to each of the measurement targets such that at least one field of depth of the imaging device includes an entire required focusing range of the measurement targets.

15. The three-dimensional measurement method according to claim 11, wherein
the mapping includes mapping the height position of the measurement module to each of the measurement targets such that at least one field of depth of the imaging device includes an entire required focusing range of the measurement targets.

16. The three-dimensional measurement method according to claim 12, wherein
the mapping includes mapping the height position of the measurement module to each of the measurement targets such that at least one field of depth of the imaging device includes an entire required focusing range of the measurement targets.

* * * * *